(12) United States Patent  (10) Patent No.: US 7,518,370 B2
Huang et al.  (45) Date of Patent: Apr. 14, 2009

(54) LOW EDDY CURRENT VACUUM VESSEL AND METHOD OF MAKING SAME

(75) Inventors: Xianrui Huang, Clifton Park, NY (US); Paul S. Thompson, Stephentown, NY (US)

(73) Assignee: General Electric Company, Niskayuna, NY (US)

( * ) Notice: Subject to any disclaimer, the term of this patent is extended or adjusted under 35 U.S.C. 154(b) by 239 days.

(21) Appl. No.: 11/565,498

(22) Filed: Nov. 30, 2006

(65) Prior Publication Data

US 2008/0129297 A1 Jun. 5, 2008

(51) Int. Cl.
*G01V 3/00* (2006.01)
(52) U.S. Cl. ..................................... 324/319
(58) Field of Classification Search .......... 324/300–322
See application file for complete search history.

(56) References Cited

U.S. PATENT DOCUMENTS 5,296,810 A * 3/1994 Morich ...................... 324/318
6,783,059 B2 * 8/2004 Laskaris et al. ............. 324/318
6,995,562 B2 * 2/2006 Laskaris et al. ............. 324/318
7,053,740 B1 5/2006 Laskaris
7,319,327 B2 * 1/2008 Ryan et al. .................. 324/318

FOREIGN PATENT DOCUMENTS

GB 2408582 1/2005
JP 62054982 3/1987

OTHER PUBLICATIONS

Great Britain Search Report—Mar. 13, 2008.

* cited by examiner

*Primary Examiner*—Dixomara Vargas
(74) *Attorney, Agent, or Firm*—Jason K. Klindtworth

(57) ABSTRACT

A vacuum vessel assembly includes an inner cylinder and an outer cylinder formed of a material in which eddy currents are substantially not produced. The inner cylinder includes a first and second half having an annular flange thereon. A plurality of metal interfaces are connected to the inner cylinder and the outer cylinder. The plurality of metal interfaces bond the first half and second half of the inner cylinder and also bond the inner cylinder to the outer cylinder.

10 Claims, 5 Drawing Sheets

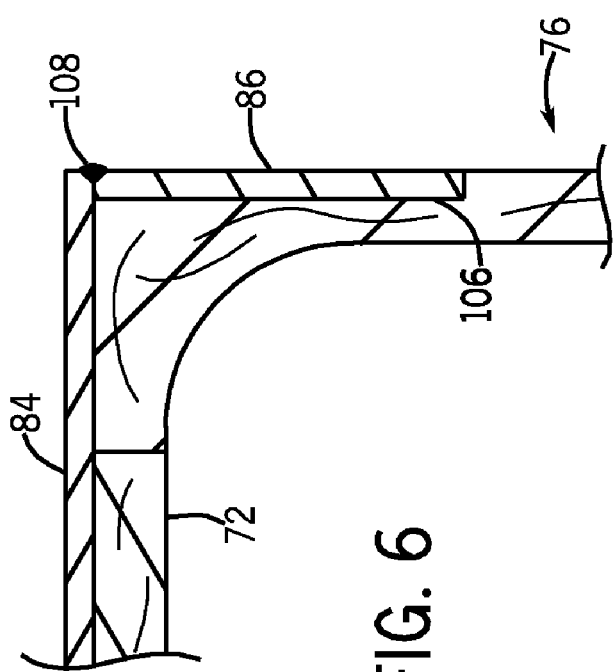
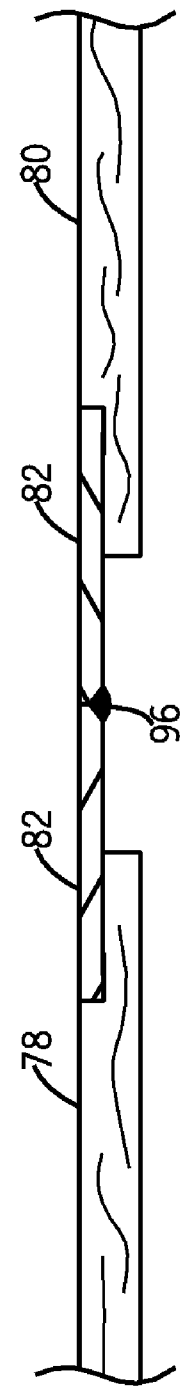

LOW EDDY CURRENT VACUUM VESSEL AND METHOD OF MAKING SAME

BACKGROUND OF THE INVENTION

The invention relates generally to a magnetic resonance imaging (MRI) system and more particularly to a low eddy current vacuum vessel for enclosing a superconducting magnet in the MRI system and a process for manufacturing the vacuum vessel.

MRI systems utilize superconducting magnets to generate a strong, uniform magnetic field within which a patient or other subject is placed. Magnetic gradient coils and radio-frequency transmit and receive coils then influence gyromagnetic materials in the subject to provoke signals that can be used to form useful images. Other systems that use such coils include spectroscopy systems, magnetic energy storage systems, and superconducting generators.

In use with MRI, a superconducting magnet is disposed in a vacuum vessel that insulates the magnet from the environment during operation. The superconducting magnet also has a coil support structure to support the coil in a cooling mass and a helium vessel for cooling. The helium vessel is a pressure vessel located within the vacuum vessel for thermal isolation and typically contains liquid helium to provide cooling for the superconducting magnet to maintain a temperature of around 4.2 Kelvin for superconducting operation.

The vacuum vessel in an MRI system is generally made of components that are welded together during assembly of the magnet to form a pressure boundary. The function of the vacuum vessel of an MRI magnet is to provide a reliable pressure boundary for maintaining proper vacuum operation. Vacuum vessels known in the art are usually made of metals such as stainless steel, carbon steel, and aluminum. Although, metal vacuum vessels are strong enough to resist vacuum forces, they generate eddy currents and unwanted field distortions in the imaging volume when exposed to an AC field, such as an AC field generated by gradient coils of the MR system. When the magnet is operated in an AC field environment, eddy currents will be induced in those metal components. The eddy currents in the vacuum vessel of a MRI system generate un-wanted field distortions in the imaging volume and adversely affect the image quality. The eddy current heating may also cause structural or thermal problems. That is, the AC losses add to the total heat load and increase costs for maintain the helium at a cryogenic temperature.

While the composition of the vacuum vessel plays a significant role in reducing eddy currents, the structural integrity of the vacuum vessel is also important in order for the MRI system to operate efficiently. The vacuum vessel needs to provide a reliable pressure boundary to maintain vacuum operation. Any leakage and gas permeation into and out of the vacuum vessel will, over time, increase the vacuum pressure and thus increase the heat load of the magnet.

Thus, there is a need for reducing field effect losses from eddy currents in a vacuum vessel and for ensuring that the vacuum vessel is free of leaks to provide a reliable pressure boundary.

BRIEF DESCRIPTION OF THE INVENTION

The present invention overcomes the aforementioned drawbacks by providing an apparatus, and a method of manufacturing thereof, for reducing the formation of eddy currents in a vacuum vessel and for ensuring that the vacuum vessel is free of leaks to provide a reliable pressure boundary.

Therefore, in accordance with one aspect of the current invention, a magnetic resonance imaging (MRI) system includes at least one magnet for generating a magnetic field and at least one gradient coil for manipulating the magnetic field generated by the at least one magnet by way of a gradient field. The MRI system further includes a vacuum vessel enshrouding the at least one magnet that includes an inner cylinder formed of a non-metallic material in which eddy currents are substantially reduced during an operation of the at least one gradient coil, wherein the inner cylinder includes a first and second half having an annular flange thereon. The vacuum vessel also includes an outer cylinder formed of a non-metallic material in which eddy currents are substantially reduced during operation of the at least one gradient coil.

In accordance with another aspect of the present invention, a method for manufacturing a vacuum vessel in a MRI system includes the steps of forming first and second halves of a flanged inner cylinder of a composite material, attaching metal connectors to a non-flanged end on each of the first and second halves and welding the metal connectors to connect the first and second halves. The method further includes the steps of forming an outer cylinder of a composite material and attaching a plurality of metal interfaces to the flanged inner cylinder and the outer cylinder.

In accordance with yet another aspect of the present invention, a vacuum vessel assembly for use in cooling superconducting magnets includes a plurality of composite annulus spacers and a plurality of composite plies attached to the plurality of composite annulus spacers and configured to form a pair of inner cylinder-flange components. The vacuum vessel assembly further includes a composite outer cylinder and a plurality of metal interfaces configured to weldingly connect the pair of inner cylinder-flange components and weldingly connect the pair of inner cylinder-flange components to the outer cylinder, wherein the plurality of metal interfaces are positioned to reduce eddy currents in the vacuum vessel assembly.

Various other features and advantages of the present invention will be made apparent from the following detailed description and the drawings.

BRIEF DESCRIPTION OF THE DRAWINGS

The drawings illustrate one embodiment presently contemplated for carrying out the invention.

In the drawings:

FIG. 5 is a detailed view of section 4-4 of FIG. 4.

FIG. 6 is a detailed view of section 5-5 of FIG. 4.

DETAILED DESCRIPTION OF THE PREFERRED EMBODIMENT

Figure 1:
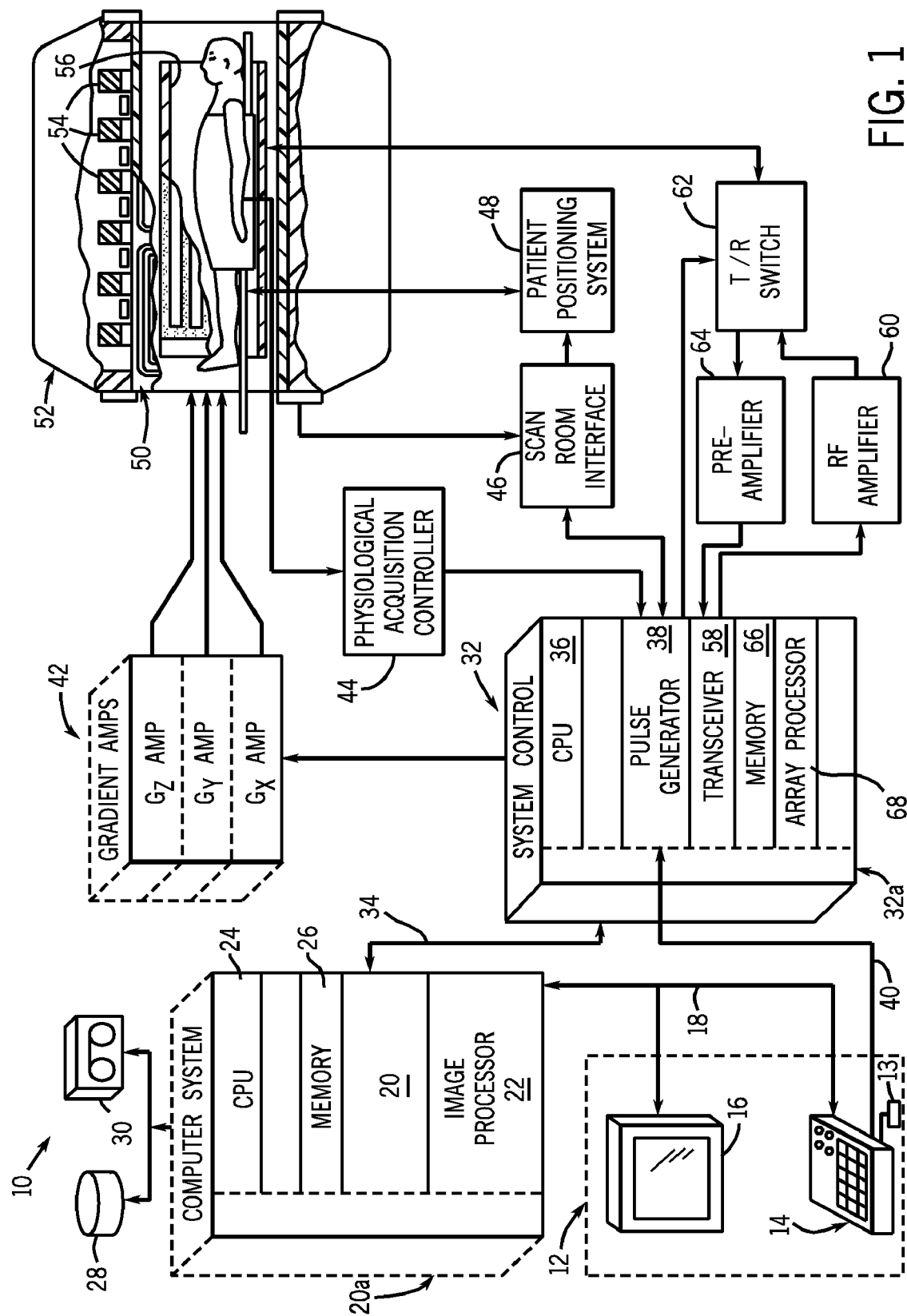
FIG. 1 is a block diagram and schematic of a magnetic resonance imaging (MRI) system according to an embodiment of the present invention.

Referring to FIG. 1, the major components of a preferred magnetic resonance imaging (MRI) system 10 incorporating an embodiment of the present invention is shown. The operation of the MR system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and removable storage 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a superconducting magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the removable storage 30, or it may be further processed by the image processor 22 and conveyed to the operator console 12 and presented on the display 16.

Figure 2:
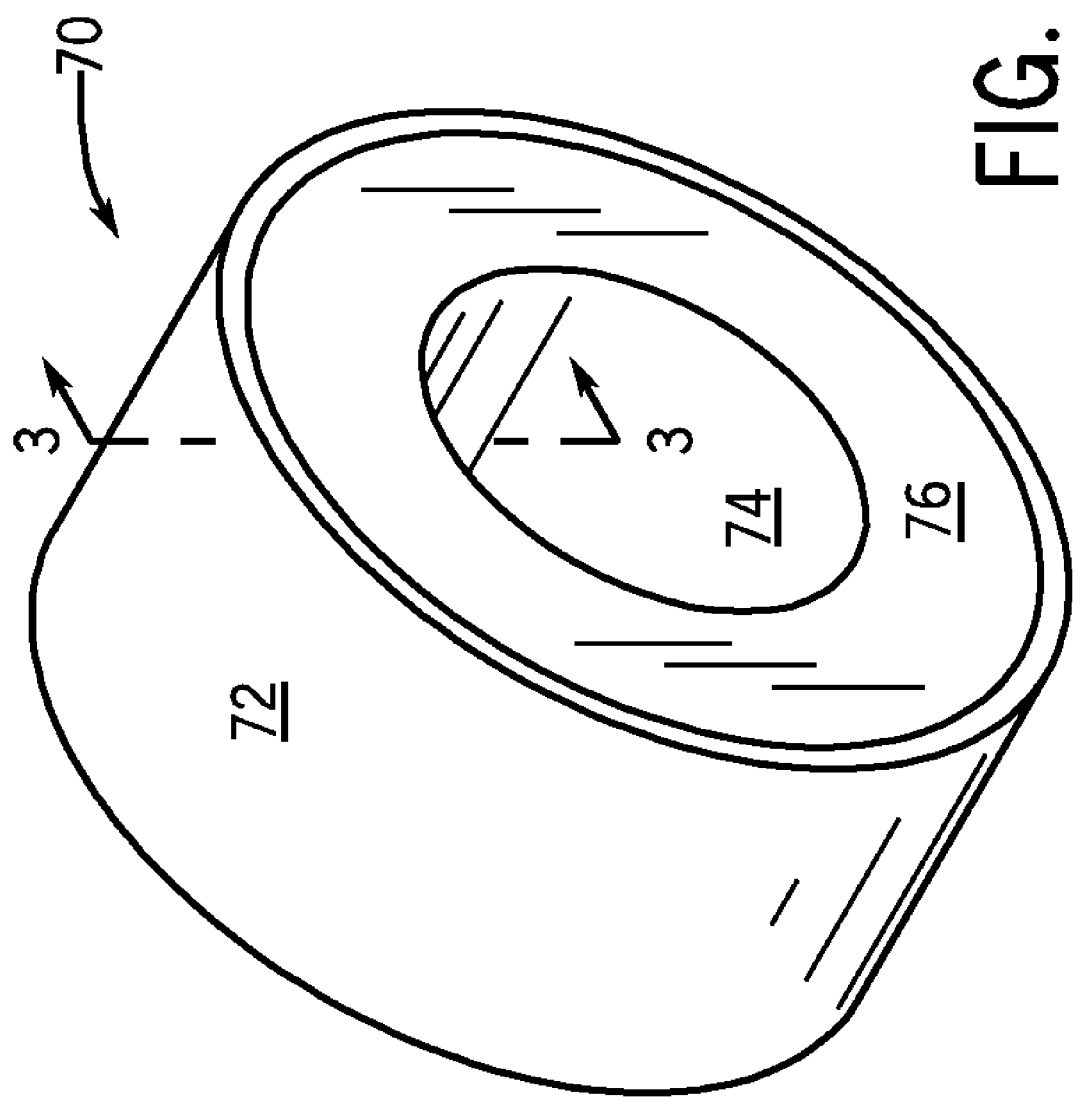
FIG. 2 is a perspective view of a vacuum vessel assembly according to an embodiment of the present invention.

As shown in FIG. 2, MRI system 10 also includes a vacuum vessel assembly 70 that enshrouds and encloses superconducting magnet 54 of FIG. 1. The vacuum vessel assembly 70 has an outer cylinder 72 and an inner cylinder 74 that are arranged concentric to each other with respect to their central axes. The outer cylinder 72 and the inner cylinder 74 are generally composed of a composite material that is resistive to the formation of eddy currents therein. Preferably, the composite material is in the form of a carbon fiber or glass fiber, such as G10, although it is envisioned that other suitable materials may also be used. Annular flanges 76, on opposing sides of vacuum vessel assembly 70, are also arranged axially to the composite cylinders 72, 74, such that the annular flanges 76 and the composite cylinders 72, 74 together form a vacuum chamber within the vacuum vessel assembly 70. It may be noted that the diameter of the outer cylinder 72 and the outer diameters of the annular flanges 76 are generally the same. Similarly, the diameter of the inner cylinder 74 and the inner diameters of the annular flanges 76 are similarly the same.

Figure 3:
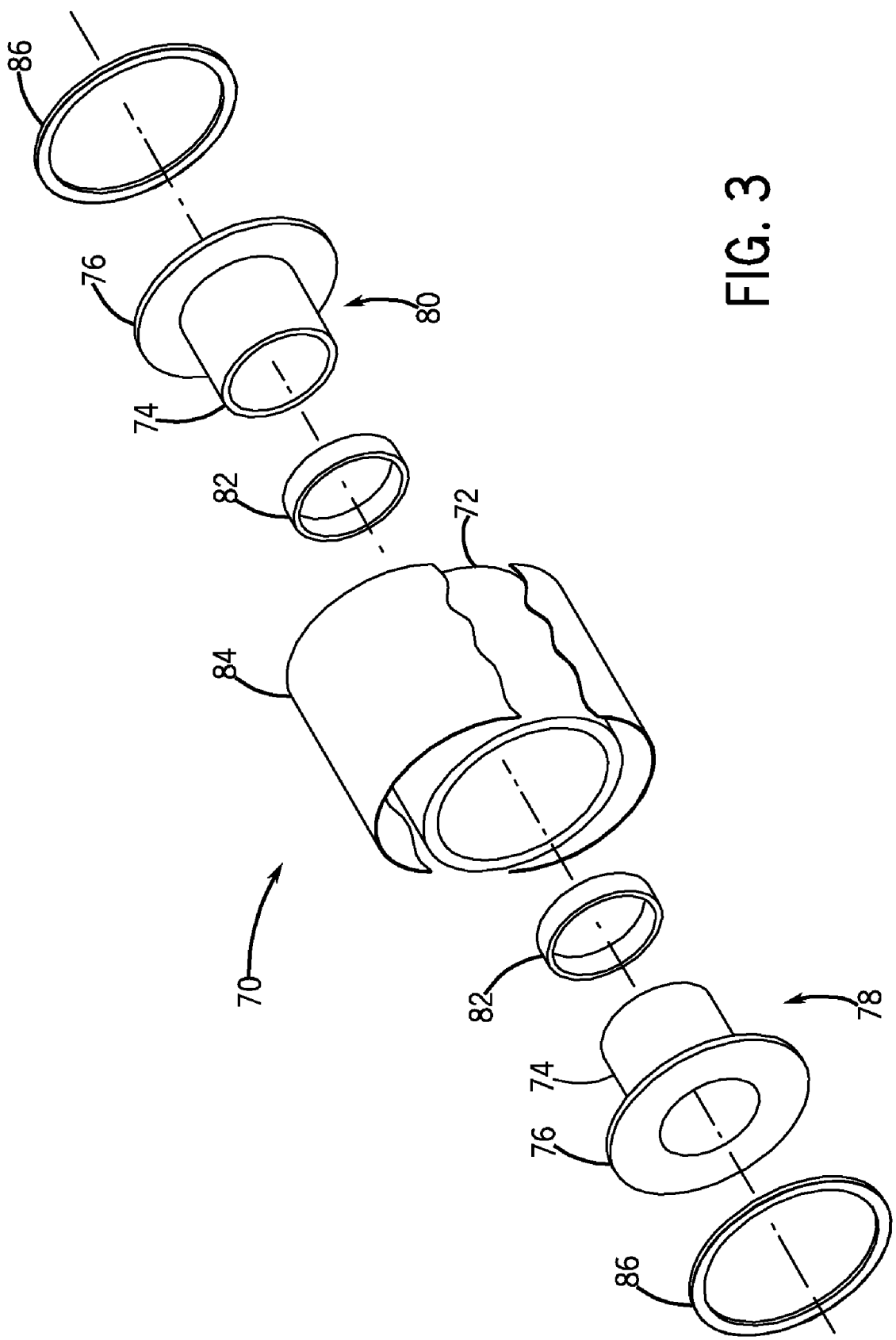
FIG. 3 is an exploded view of the vacuum vessel assembly of FIG. 2.

Turning now to FIG. 3, an exploded view of the vacuum vessel assembly 70 of FIGS. 1 and 2 is shown. As illustrated therein, vacuum vessel assembly 70 includes outer cylinder 72 and inner cylinder 74, the inner cylinder 74 being further comprised of a first half 78 and a second half 80, forming left and right halves of inner cylinder 74. Vacuum vessel assembly 70 also includes a plurality of metal interfaces 82, 84, 86 used to join the first and second halves 78, 80 of the inner cylinder 70, to connect the inner cylinder 74 and the outer cylinder 72, and to connect the vacuum vessel assembly 70 to other structural components (not shown) in the MRI system. The metal interfaces 82, 84, 86 are formed of a non-magnetic conductive metal, such as stainless steel, carbon steel, or aluminum, that is conducive to welding operations. The metal interfaces 82, 84, 86 include a pair of inner diameter (ID) metal rings 82 attached to the inner cylinder halves 78, 80, a metal envelope 84 that wraps around outer cylinder 72, and outer diameter (OD) metal rings 86 that attach to the annular flanges 76 of inner cylinder 74. The metal interfaces 82, 84, 86 provide for a welding interface to construct the vacuum vessel assembly 70, as will be explained in greater detail below.

Figure 4:
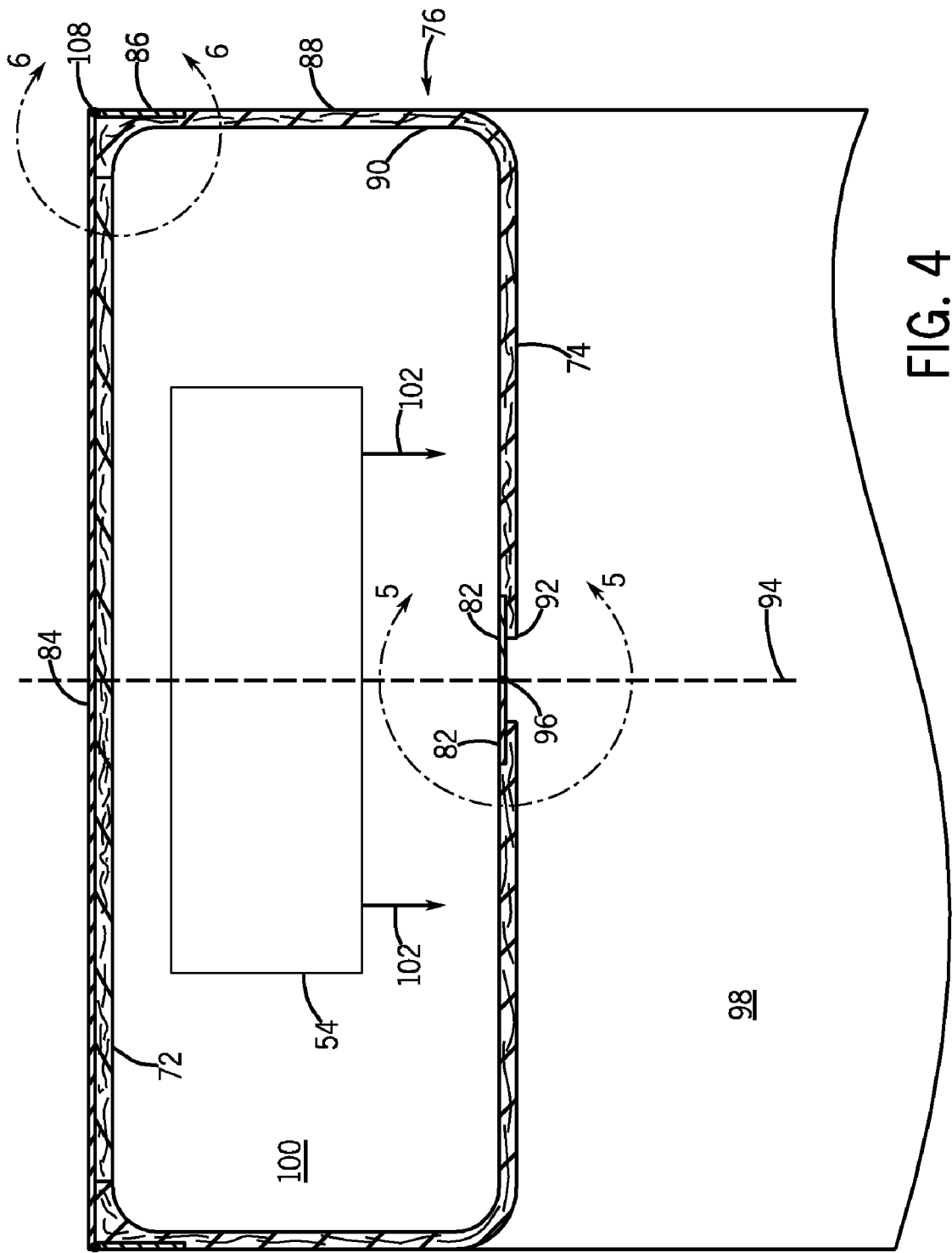
FIG. 4 is a side cross-sectioned view taken along line 3-3 of FIG. 2.

As stated above, the inner cylinder 74 of vacuum vessel assembly 70 includes a first half 78 and a second half 80. The first and second halves 78, 80 of inner cylinder 74 each contain an annulus flange 76 thereon. In a preferred embodiment, and as shown in FIG. 4, first and second halves 78, 80 of the inner cylinder 74 are formed starting with a composite annulus spacer 88, formed of a material such as G10. While G10 is a preferred material, other suitable materials, including other glass fiber reinforced plastics are also envisioned. Carbon fiber plies 90 are laid on both sides of the annulus spacer 88 to form the annular flange 76 and the inner cylinder 74. The carbon fiber plies 90 are uni-axial and are electrically insulated from each other to prevent eddy currents flowing across the plies. This can be done by putting an insulating material, such as a glass fiber, in between the carbon fiber plies 90. Such a construction provides increased bending stiffness to the annular flange 76, and between the annular flange 76 and inner cylinder 74.

To join the first and second halves 78, 80 of the inner cylinder 74, an ID metal ring 82 is attached to the non-flanged end 92 of the first and second halves 78, 80 of the inner cylinder 74. Preferably, the ID metal rings 82 are glued to the composite material of the first and second halves 78, 80; however, it is also envisioned that the ID metal rings 82 can be attached by way of another suitable bonding material or process. Once secured to the first and second halves 78, 80 of the inner cylinder 74, the ID metal rings 82 provide a suitable interface for welding the first half 78 of the inner cylinder to the second half 80. Thus, first and second halves 78, 80 can be welded together to form a contiguous inner cylinder 74, as illustrated by welding connection 96 in FIG. 5. Referring again to FIG. 4, as the inner cylinder 74 is formed separate and apart from the outer cylinder 72, it is envisioned that the welding connection 96 between the first half 78 and second half 80 can be checked for leaks. If leaks in the welding connection 96 are found, the welding connection 96 can be refashioned or welded over to fix such leaks.

In addition to providing a welding interface for the first and second halves 78, 80 of the inner cylinder 74, ID metal rings 82 are also positioned to minimize their magnetic flux linkage with the gradient pulsing fields in the MRI system 10, thus reducing eddy current heating in the vacuum vessel assembly 70. As positioned, the net magnetic flux enclosed by ID metal rings 82 at the magnet mid-plane 94 is zero for x-, y-, and z-gradients (i.e., Gx, Gy, and Gz).

Referring back to FIG. 4, a thin metal envelope 84 is arranged radially over the composite outer cylinder 72. Preferably, the metal envelope 84 is glued to the composite material of the outer cylinder 72; however, it is also envisioned that the metal envelope 84 can also be attached by way of other suitable bonding processes. The metallic envelope 84 alone is not sufficiently strong to withstand the forces resulting from the pressure difference when a vacuum is drawn within the vacuum vessel assembly 70. However, when combined with the underlying composite outer cylinder 72, the metal envelope 84 is capable of withstanding the vacuum load and provides added structural support to the outer cylinder 74. Additionally, metal envelope 84 provides a pressure boundary for the vacuum vessel assembly 70 to create an air-tight boundary to prevent leakage into the vacuum vessel assembly 70 through the composite outer cylinder 74.

Preferably, the metal envelope 84 has a minimal thickness, as the use of a thin metal envelope 84 reduces the influence of AC fields on the overall vacuum vessel assembly 70. It may be noted that the magnetic field of MRI system 10, particularly important within bore 98, is not influenced to a large extent by metal envelope 84 surrounding outer cylinder 72. This is because the superconducting magnet 54, located in vacuum volume 100, provides a magnetic field that is directed into the bore 98, as indicated by electromagnetic waves 102.

Outer diameter (OD) metal rings 86 are also shown in FIG. 4 attached to annular flange 76 of inner cylinder 74. The OD metal rings 86 are positioned to attach to a groove 106 formed into annular flange 76. Thus, when OD metal rings 86 are attached to the composite annular flange 76 via gluing or a similar bonding process, a flat surface is formed along the face of the entire annular flange 76, as shown in FIG. 4. OD metal rings 86 are also axially positioned to contact metal envelope 84 wrapped around outer cylinder 72. The OD metal rings 86 and metal envelope 84 thus provide a welding interface for the components to be welded together, as identified by welding connection 108 in FIG. 6. Similar to the welding of the inner cylinder halves 78, 80, the welding connection 108 between the OD metal rings 86 and metal envelope 84 can then be checked for leaks. If a leak is detected, further welding can be performed on the welding connection 108 to ensure that there is a vacuum seal between the inner cylinder 74 and outer cylinder 72 that is free of leaks. The position of OD metal rings 86 also minimizes their magnetic flux linkage with the gradient pulsing fields in the MRI system, thus reducing eddy current heating in the vacuum vessel assembly 70.

In a further embodiment of the invention, it is also envisioned that a permeation resistant coating can be applied to the inner cylinder 74 and outer cylinder 72 of the vacuum vessel assembly 70 to improve vacuum performance. That is, before the inner cylinder 74 is welded to the outer cylinder 72, a permeation resistant coating is applied to inner cylinder 74. An additional permeation resistant coating is also applied to outer cylinder 72 before metal envelope 84 is connected thereto.

While the embodiments above describe a welding process as one preferred form of connecting the various components of vacuum vessel assembly 70, it is also envisioned that other bonding processes could be used to join the composite inner cylinder 74 with the outer cylinder 72, and join the first and second halves 78, 80 of the inner cylinder 74.

Therefore, in accordance with one embodiment of the current invention, a magnetic resonance imaging (MRI) system includes at least one magnet for generating a magnetic field and at least one gradient coil for manipulating the magnetic field generated by the at least one magnet by way of a gradient field. The MRI system further includes a vacuum vessel enshrouding the at least one magnet that includes an inner cylinder formed of a non-metallic material in which eddy currents are substantially reduced during an operation of the at least one gradient coil, wherein the inner cylinder includes a first and second half having an annular flange thereon. The vacuum vessel also includes an outer cylinder formed of a non-metallic material in which eddy currents are substantially reduced during operation of the at least one gradient coil.

In accordance with another embodiment of the present invention, a method for manufacturing a vacuum vessel in a MRI system includes the steps of forming first and second halves of a flanged inner cylinder of a composite material, attaching metal connectors to a non-flanged end on each of the first and second halves and welding the metal connectors to connect the first and second halves. The method further includes the steps of forming an outer cylinder of a composite material and attaching a plurality of metal interfaces to the flanged inner cylinder and the outer cylinder.

In accordance with yet another embodiment of the present invention, a vacuum vessel assembly for use in cooling superconducting magnets includes a plurality of composite annulus spacers and a plurality of composite plies attached to the plurality of composite annulus spacers and configured to form a pair of inner cylinder-flange components. The vacuum vessel assembly further includes a composite outer cylinder and a plurality of metal interfaces configured to weldingly connect the pair of inner cylinder-flange components and weldingly connect the pair of inner cylinder-flange components to the outer cylinder, wherein the plurality of metal interfaces are positioned to reduce eddy currents in the vacuum vessel assembly.

The present invention has been described in terms of the preferred embodiment, and it is recognized that equivalents, alternatives, and modifications, aside from those expressly stated, are possible and within the scope of the appending claims.

What is claimed is:

1. A magnetic resonance imaging (MRI) system comprising:
   at least one magnet for generating a magnetic field;
   at least one gradient coil for manipulating the magnetic field generated by the at least one magnet by way of a gradient field; and
   a vacuum vessel enshrouding the at least one magnet, wherein the vacuum vessel further comprises:
      an inner cylinder formed of a non-metallic material in which eddy currents are substantially reduced during operation of the at least one gradient coil, wherein the inner cylinder includes a first and second half having an annular flange thereon; and
      an outer cylinder formed of a non-metallic material in which eddy currents are substantially reduced during operation of the at least one gradient coil.

2. The magnetic resonance imaging (MRI) system of claim 1 further comprising a plurality of metal interfaces connected to the inner cylinder and outer cylinder, wherein the plurality of metal interfaces bond the first half and second half of the inner cylinder and bond the inner cylinder and outer cylinder.

3. The magnetic resonance imaging (MRI) system of claim 2 wherein the plurality of metal interfaces includes a metal envelope wrapped around the outer cylinder.

4. The magnetic resonance imaging (MRI) system of claim 2 wherein the plurality of metal interfaces includes an outer diameter metal ring applied to the annular flanges.

5. The magnetic resonance imaging (MRI) system of claim 2 wherein the plurality of metal interfaces includes inner diameter metal rings applied to a non-flanged end of the first half and the second half of the inner cylinder.

6. The magnetic resonance imaging (MRI) system of claim 2 wherein the plurality of metal interfaces are positioned to minimize magnetic flux linkage with the gradient field.

7. The magnetic resonance imaging (MRI) system of claim 2 wherein the plurality of metal interfaces are glued to the inner cylinder and the outer cylinder.

8. The magnetic resonance imaging (MRI) system of claim 1 wherein the first half and second half of the inner cylinder further comprise:
   an annulus spacer formed of a material in which eddy currents are substantially reduced during an operation of the at least one gradient coil; and
   a plurality of carbon fiber plies configured to attach to the annulus spacer.

9. The magnetic resonance imaging (MRI) system of claim 1 wherein the vacuum vessel further comprises a permeation resistive coating applied to the inner cylinder and the outer cylinder.

10. The magnetic resonance imaging (MRI) system of claim 1 wherein the non-metallic material in which eddy currents are substantially reduced comprises at least one of a carbon fiber, a glass fiber composite, and a G-10 material.

* * * * *